United States Patent [19]
Katsu et al.

[11] Patent Number: 5,430,616
[45] Date of Patent: Jul. 4, 1995

[54] INTERCONNECTOR AND ELECTRONIC DEVICE ELEMENT WITH THE INTERCONNECTOR

[75] Inventors: Tomoji Katsu; Keiji Shimada, both of Kitakatsuragi; Hideki Yoshioka, Nara, all of Japan

[73] Assignee: Sharp Kabushiki Kaisha, Osaka, Japan

[21] Appl. No.: 113,687

[22] Filed: Aug. 31, 1993

[30] Foreign Application Priority Data

Sep. 8, 1992 [JP] Japan .................. 4-239711
Oct. 8, 1992 [JP] Japan .................. 4-270045
Oct. 30, 1992 [JP] Japan .................. 4-292707

[51] Int. Cl.[6] ............................ H05K 7/02
[52] U.S. Cl. .................... 361/809; 174/126.4; 174/261; 361/807; 439/456
[58] Field of Search ........... 174/126.1, 126.3, 126.4, 174/68.2, 68.3, 70 C, 73.1, 261; 361/772, 776, 777, 779, 789, 807, 809, 810, 769, 771, 775, 778, 787; 439/449, 452, 453, 456, 457, 458

[56] References Cited
FOREIGN PATENT DOCUMENTS
1-198082  8/1989  Japan .
4-284677 10/1992  Japan .

*Primary Examiner*—Leo P. Picard
*Assistant Examiner*—D. Sparks

[57] ABSTRACT

An interconnector includes a first connecting portion connected to a front surface electrode of a solar cell, a second connecting portion connected to a rear surface electrode of another solar cell connected in serial direction, and a stress relief portion formed between the first connecting portion and the second connecting portion for absorbing displacement. The width of the first connecting portion in the parallel direction is made smaller than the width of the stress relief portion in the parallel direction. By this structure, the width of the front surface electrode of the solar cell can be reduced, the effective light receiving area of the solar cell can be increased, and therefore the efficiency in generating power can be improved.

24 Claims, 18 Drawing Sheets

A = 9.00E+0.2
B = 2.50E+0.3
C = 4.10E+0.3
D = 5.70E+0.3
E = 7.30E+0.3
F = 8.90E+0.3
G = 1.05E+0.4
H = 1.21E+0.4
I = 1.37E+0.4
($N/mm^2$)

A = 9.00E +0.2
B = 2.60E +0.3
C = 4.30E +0.3
D = 6.00E +0.3
E = 7.70E +0.3
F = 9.40E +0.3
G = 1.11E +0.4
H = 1.28E +0.4
I = 1.45E +0.4
J = 1.62E +0.4   (N/mm$^2$)

INTERCONNECTOR AND ELECTRONIC DEVICE ELEMENT WITH THE INTERCONNECTOR

BACKGROUND OF THE INVENTION

1. Field of the Invention

The present invention relates to an interconnector for connecting electronic device elements electrically in serial or parallel direction and to an electronic device element using the same. More specifically, the present invention relates to an improvement in a planar type interconnector used for solar cells for artificial satellite or diodes, and to electronic device elements such as solar cells and diodes using the same.

2. Description of the Background Art

Interconnectors which are metal strips for electrically connecting a plurality of electronic device elements in serial or parallel direction are broadly classified into three dimensional ones and planar ones dependent on whether a stress relief which is a portion for absorbing displacement generated between elements connected with each other has three dimensional shape or a planar shape. A prior art example of the planar type interconnector, to which the present invention is directed, will be described with reference to solar cells mounted on an artificial satellite, by way of example.

FIG. 13 shows a planar type interconnector for solar cells mounted on an artificial satellite. An interconnector 1 shown in FIG. 13 is provided with a front surface electrode connecting portion 2 which is connected to a front surface electrode of a solar cell, and a rear surface electrode connecting portion 3 which is connected to a rear surface electrode of another solar cell which is neighboring the former solar cell in the serial direction. At a region between front surface electrode connecting portion 2 and rear surface electrode connecting portion 3, a stress relief portion 4 for absorbing displacement generated between front surface electrode connecting portion 2 and rear surface electrode connecting portion 3 is provided.

Stress relief portion 4 has two approximately parallel slits 5 and 6 for absorbing displacement. Slits 5 and 6 have closed ends 5a and 6a with approximately circular notches the diameter of which is larger than the width of the slit, and open ends 5b and 6b, respectively.

The width of stress relief portion 4 in the parallel direction (left and right direction of FIG. 13), that is, the distance W2 between left and right ends is the same as the width W1 of front surface electrode connecting portion 2 in the parallel direction as well as the width W3 of rear surface electrode connecting portion 3 in the parallel direction. If the largest value of the width in the parallel direction in the interconnector 1 as a whole is represented as W4, the widths W1, W2, W3 and W4 are all the same in interconnector 1 of this prior art example.

The conventional interconnector for solar cells such as described above is disclosed, for example, in Japanese Patent Laying-Open Nos. 1-198082 and 4-284677.

A solar paddle for artificial satellite generally used in the prior art employing the above-described conventional interconnector 1 will be described with reference to FIGS. 14A and 14B. In the solar paddle shown in FIGS. 14A and 14B, rear surface electrode connecting portion 3 of interconnector 1 is connected to the rear surface electrode of solar cell 7 and adhere on a substrate 9 by means of an adhesive 8. Front surface electrode connecting portion 2 is connected to the front surface electrode of solar cell 10 which is next to solar cell 7 in the serial direction, that is, the longitudinal direction of FIG. 14A, and solar cell 10 is also adhered on substrate 9 by adhesive 8.

When solar paddle is used in an environment such as space in which temperature cycle ranges widely from about $-180°$ C. to $+100°$ C., for example, the distance between rear surface electrode connecting portion 3 and front surface electrode connecting portion 2 of interconnector 1 connecting solar cells 8 and 10 changes, because of the difference in thermal characteristics (for example coefficient of thermal expansion) of solar cells 7 and 10, substrate 9, interconnector 1 and adhesive 8, respectively. The change of the distance is absorbed at stress relief portion 4 by means of the change of the width of slits 5, 6 and then the stress is relaxed.

FIG. 15 is a plan view showing a plurality of solar cells connected not only in serial direction but in parallel direction. In this case, in addition to interconnectors 1 for serial connection, interconnectors 12 for connecting rear surface electrodes of solar cells in parallel directions are used.

FIG. 16 is a plan view of another example of solar cells connected both in serial and parallel directions, in the similar manner as shown in FIG. 16. As for the manner of connection in parallel direction of the solar cells in the example of FIG. 16, connection in both the serial and parallel directions is effected by one interconnector 13. Since interconnector 13 has a connecting portion 13a for parallel connection extending in the parallel direction, the width thereof as a whole is larger as compared with the interconnector 1 used only for serial connection.

The conventional interconnectors 1, 12 and 13 described above have the following disadvantages.

In the conventional interconnector 1 for serial connection shown in FIG. 13, the width W1 of front surface electrode connecting portion 2 is the same as the width W4 of the whole interconnector 1 as well as the width W2 of stress relief portion 4, and therefore, the width of the front surface electrode of solar cell connected to interconnector 1 must have a width at least wider than the width W1 of front surface electrode connecting portion 2, that is, wider than the width W4 of the whole interconnector 1. Accordingly, the front surface electrode of the solar cell occupies large area of the light receiving surface of the solar cell, reducing effective light receiving area with respect to the entire planar area of the solar cell, that is, reducing the ratio of area having the function of effectively converting the received light to power. This prevents improvement of power generating efficiency of the solar cells.

When solar cells connected in serial direction by using interconnector 1 are to be connected in parallel as shown in FIG. 15, separate interconnectors 12 for parallel connection are required. This increases the number of parts constituting the solar paddle, increasing the cost for assembly.

Further, when solar cells are to be connected both in the serial and parallel directions by means of one interconnector 13 as shown in FIG. 16, the width of interconnector 13 as a whole is further increased since it has a rear surface electrode connecting portion 13a for parallel connection and a stress relief portion 13b for absorbing displacement generated in the parallel direction, and therefore handling of the connector is troublesome. Further, the interconnector 13 is not suitable for connecting solar cells only in the serial direction, as the connecting portion for parallel connection is a hindrance.

A conventional thin type diode element with interconnectors for space use, connected by interconnectors having approximately the same shape as the above described conventional interconnector 1 will be described. FIG. 17A is a plan view and FIG. 17B is a cross section thereof. For convenience, a reflecting plate 39 and an insulating film 35 of FIG. 17B are omitted in FIG. 17A.

Referring to FIGS. 17A and 17B, a semiconductor substrate 31 is used as a substrate for a diode 42. Semiconductor substrate 31 is of a p or n type silicon single crystal having the size of about 1 to about 10 cm square and thickness of about 0.1 to 0.5 mm. By forming a diffusion layer 32 having opposite conductivity type to the impurities of the substrate, a pn junction 33 is formed, which function as a diode. The surface of the substrate is covered by an oxide film 34, which is further covered by an insulating film 35 thereon. An opening 34a is provided in oxide film 34 on which opening 34a metal is deposited to form an electrode 36. By depositing metal on the rear surface of the substrate, another electrode 37 is formed. One end of the interconnector 1 is connected to electrode 36 by welding.

On the surface of the conventional diode element, a reflecting plate 39 (an aluminum plate, a mirror or the like) is adhered by an adhesive 40 in order to improve radiation in the space, and to prevent entrance of sunlight to the semiconductor substrate to reduce leak current in reverse direction of the diode caused by photoelectric current. Semiconductor substrate 31 and interconnector 1 are insulated from each other by oxide film 34, insulating film 35 and adhesive 40. A mesa portion 41 may be formed by mesa etching on the side surface portion so as to enlarge distance between the semiconductor substrate 31 and interconnector 1. Insulation between interconnector 1 and semiconductor substrate 31 is indispensable and when this insulation fails, the diode loses its function.

The shape of interconnector 1, referring to FIG. 17A, is different from that of the interconnector 1 shown in FIG. 13 only in that front surface electrode connecting portion 2 is longer. At inner ends of slits 5 and 6, approximately circular notches 5a and 6a are provided to prevent concentration of stress. A connecting piece 52 at one end of interconnector 1 is connected to electrode 36 of diode 42. Connecting portion 3 at the other end of interconnector 1 is connected to an electrode of neighboring diode or solar cell.

As for interconnector 1 for connecting diodes of the prior art described above, since the width of interconnector 1 at both ends is uniformly wide, the area of the electrode to be connected thereto must also be wide.

Referring to FIG. 17B, semiconductor substrate 31 and interconnector 1 are insulated from each other by oxide film 34, insulating film 35 and adhesive 40. When moisture or foreign matter such as very small dust enters between semiconductor substrate 31 and interconnector 1 at the side surface portion, for example, the pn junction of diode 42 may possibly be short circuited. Since electrode 36 and interconnector 1 are insulated from reflecting plate 39 only by adhesive 40, there is also a possibility of short circuit caused by foreign matter, if any, between semiconductor substrate 31 and insulating plate 39, if the insulation is not sufficient.

When the thin plate type diode is manufactured, since it is necessary to make the mesa portion formed by mesa etching to be wider than the width of the interconnector, it is difficult to provide semiconductor substrate 31 with sufficient strength, resulting in the problem of breakage during the process of manufacturing.

SUMMARY OF THE INVENTION

An object of the present invention is to provide an interconnector in which width of a connecting portion connected to a front surface electrode of an electronic device element is small, without degrading function of absorbing displacement caused when electronic device elements are connected in serial direction.

Another object of the present invention is to provide an interconnector which enables connection both in the serial and parallel directions without increasing the width in the parallel direction, which can also be used for connection only in the serial direction without degrading the function of absorbing displacement.

A further object of the present invention is to provide electronic device element such as a solar cell and a diode employing the interconnector attaining the above described objects.

The interconnector of the present invention attaining the above described objects is for electrically connecting electronic device elements in a serial direction or in parallel direction orthogonal to the serial direction, and it is formed of a metal plate. The interconnector includes a first connecting portion connected to a front surface electrode of a first electronic device element, a second connecting portion connected to a rear surface electrode of the second electronic device element next to the first electronic device element in the serial direction, and a first stress relief portion formed between the first and second connecting portions for absorbing displacement generated between the first and second connecting portions. The width of the first connecting portion in the parallel direction is made smaller than the width in the parallel direction of the stress relief portion.

By this interconnector, the area of the front surface electrode of the electronic device element can be made smaller than in the prior art, as the first connecting portion connected to the front surface electrode of the electronic device element is made smaller than the width in the parallel direction of the stress relief portion. Consequently, if the electronic device element is a solar cell, for example, the area occupied by the front surface electrode in the entire area of the light receiving surface can be made smaller and therefore effective light receiving area having the function of effectively converting the received light to power can be increased. Thus the efficiency in generating power of the solar cell can be improved.

In a preferred embodiment, the stress relief portion of the interconnector of the present invention has an elastic slender portion extending with a prescribed angle of inclination with respect to said parallel direction, from the vicinity of one side which is continuous to the first connecting portion to the vicinity of the other side continuous to the second connecting portion.

The width of the first connecting portion in the parallel direction may be set approximately the same as the width in the parallel direction of the elastic slender portion at the interface with the surface connecting portion.

In a more preferred embodiment of the present invention, at least one of the ends extending in the longitudinal direction of the elastic slender portion provides a slit extending along the elastic slender portion and having an open end at a side of either one of the stress relief portion.

There is a notch which is an approximately circular opening having a diameter larger than the width of the slit at an end portion opposite to the open end of the slit.

In another aspect, the interconnector of the present invention includes, in addition to the structure described above, a third connecting portion which is connected to a rear surface electrode of a third electronic device element neighboring the second electronic device component in the parallel direction. Between the second and third connecting portions, there is provided a second stress relief portion for absorbing displacement generated between the second and third connecting portions, and the width in the parallel direction of the region including the second and third connecting portions is approximately the same as the width of the first stress relief portion.

Since a second stress relief portion for absorbing displacement electronic device elements connected in the parallel direction is formed in addition to the first stress relief portion for absorbing displacement generated between electronic device elements connected in the serial direction in this connector, the interconnector has the function of connecting and absorbing displacement between electronic device elements both in the serial and parallel directions. Since the width in the parallel direction of the region of the second connecting portion plus the third connecting portion is approximately the same as the width of first stress relief portion, the width in the parallel direction of the interconnector as a whole is not different from the width in the parallel direction of the interconnector used only for the connection of electronic device elements in the serial direction. Therefore, even when such connector is used only for serial connection, there is no problem of occupation of extra region in the parallel direction, and there is not a trouble in handling.

The electronic device element to which the interconnector of the present invention is applied includes solar cells for artificial satellite, diodes fixed to the same paddle on which the solar cells are arranged and so on. Connection between the front surface electrode and rear surface electrode of the electronic device elements and connecting portions of the interconnector is effected by, for example, parallel gap welding or ultrasonic welding. The connection can also be effected by a method utilizing a low melting point metal such as soldering.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described with reference to the figures.

Figure 1:
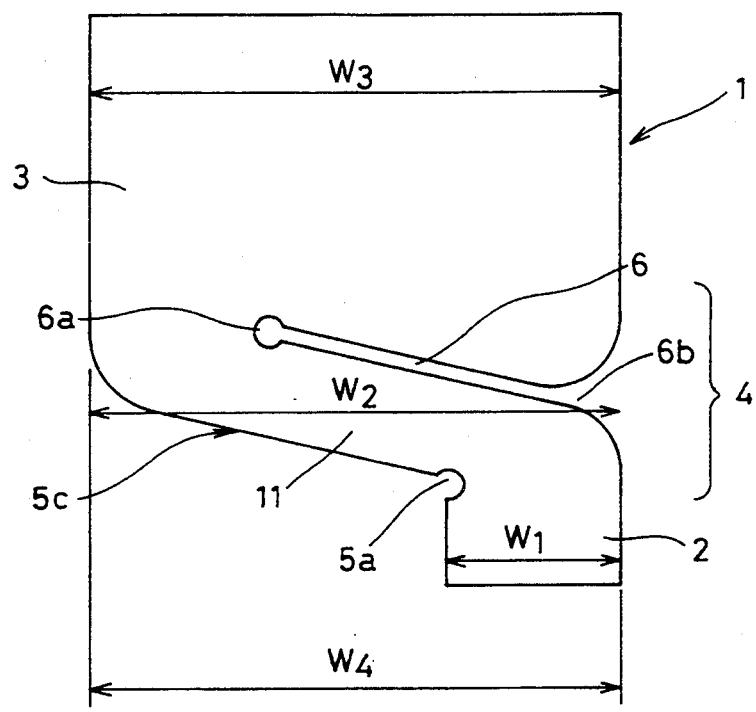
FIG. 1 shows an interconnector for connecting solar cells in accordance with a first embodiment of the present invention.

FIG. 1 shows an interconnector for connecting solar cells in accordance with the first embodiment of the present invention. In FIG. 1, portions the same as or corresponding to those of the conventional interconnector shown in FIG. 13 are denoted by the same reference characters.

An interconnector 1 in accordance with the first embodiment shown in FIG. 1 includes a front surface electrode connecting portion 2 which is connected to a front surface electrode of a solar cell, and a rear surface electrode connecting portion 3 which is connected to a rear surface electrode of another solar cell which is adjacent in serial direction to the former solar cell. In the region between front surface electrode connecting portion 2 and rear surface electrode connecting portion 3, there is provided a stress relief portion 4 for absorbing displacement generated between front surface electrode connecting portion 2 and rear surface electrode connecting portion 3.

A connect bar 11 which is an elastic slender portion of absorbing displacement extends at the stress relief portion 4 with a prescribed angle of inclination with respect to the direction of parallel connection, that is, left and right directions of FIG. 1. An upper end of connect bar 11 provides a slit 6 and at the left end of slit 6, an approximately circular notch 6a having the diameter larger than the width of slit 6 is provided. The right end of slit 6 constitutes an open end 6b. At the lower end 5c of connect bar 11, the slit is not formed. The distance between the right end of stress relief portion and the center of an approximately circular notch 5a provided at the corresponding position of the approximately circular notch 5a provided at the closed end of the lower slit 5 of the conventional interconnector shown in FIG. 13 is equal to the width W1 of front surface electrode connecting portion 2.

Figure 13:
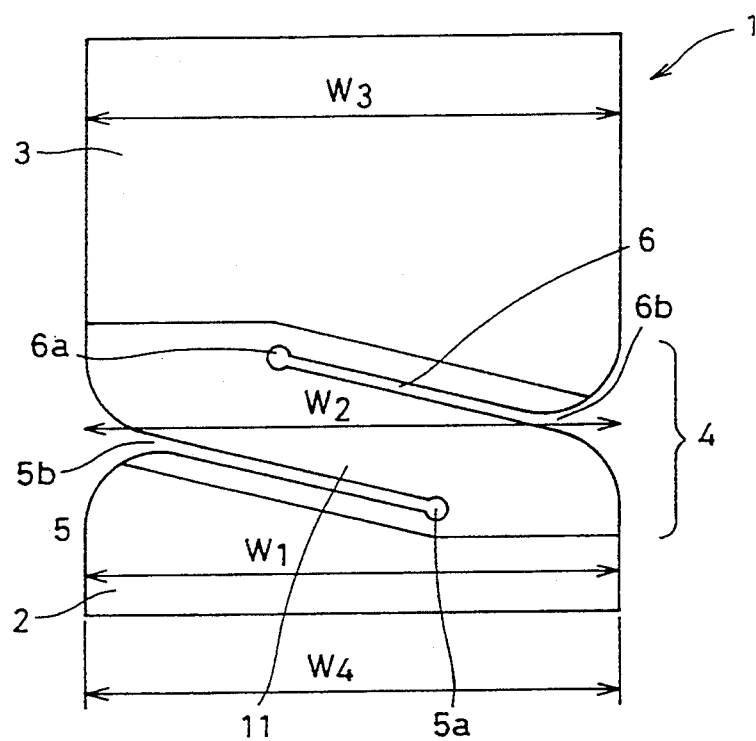
FIG. 13 shows a conventional interconnector used only for the connection in the serial direction of solar cells.

As compared with the conventional interconnector shown in FIG. 13 in which the width W4 of stress relief portion 4 is approximately the same as the width 1 of front surface electrode connecting portion 2, in the interconnector of the present embodiment, lower portion of slit 5 of interconnector shown in FIG. 13 has been removed. Consequently, the width W1 of front surface electrode connecting portion 2 of interconnector 1 of the present embodiment is significantly reduced than the maximum width W4 of the whole interconnector 1.

Though the notches 5a and 6a are approximately circular in this embodiment, the notches may have polygonal shape.

By such structure, the surface area of front surface electrode of the solar cell to which the front surface electrode connecting portion 2 is fixed and connected can be made relatively small. Accordingly, the ratio of the area occupied by the effective light receiving surface of the solar cell can be increased. As for the width of the rear surface electrode connecting portion 3 connected to the rear surface electrode of the solar cell, the width W3 of the rear surface electrode connecting portion 3 is approximately the same as the maximum width W4 of the whole interconnector 1 as well as the width W2 of stress relief portion 4 in the present embodiment, since it is not connected to the light receiving surface of the solar cell.

Figure 18A:
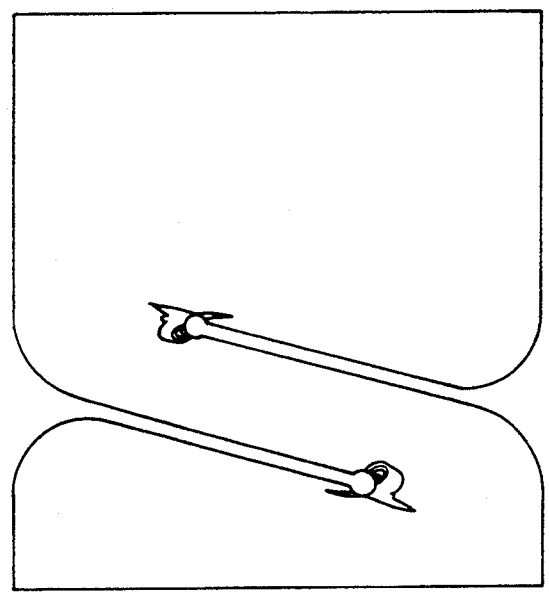
FIG. 18A shows, in the form of stress contour, the result of analysis in accordance with finite method of the stress generated in the conventional interconnector shown in FIG. 13.
Figure 18B:
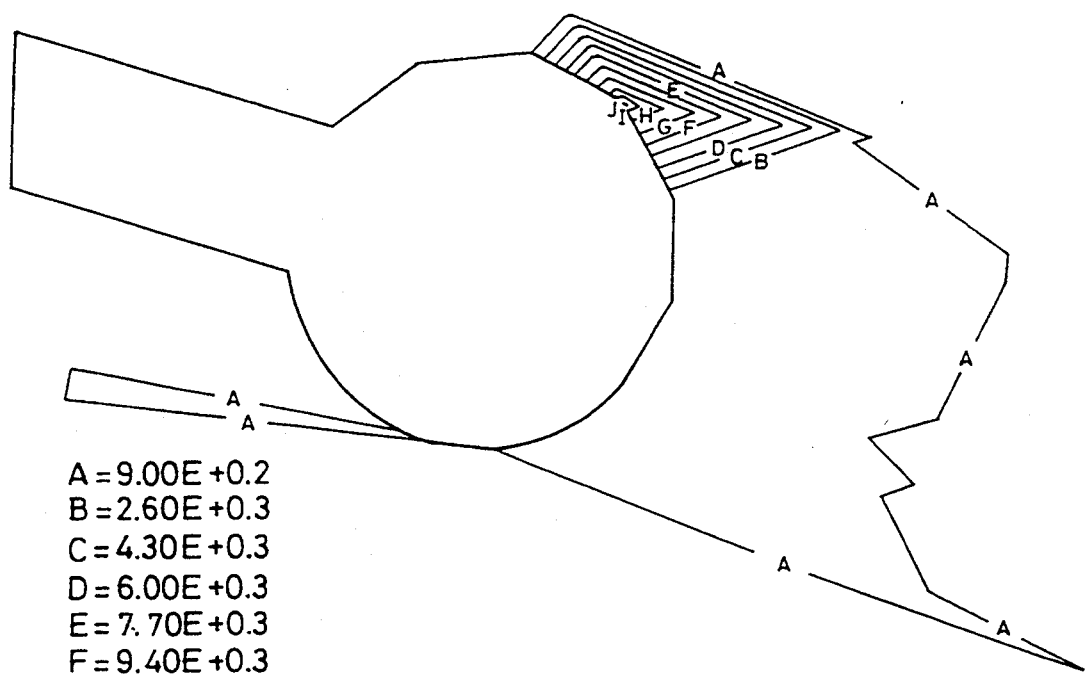
FIG. 18B shows, in enlargement, the vicinity of the notch 5a of FIG. 18A.

Now, how such an interconnector as shown in FIG. 1 has been made will be described comparing FIGS. 18A and 18B with FIGS. 2A and 2B. FIGS. 18A and 18B show results of analysis obtained by simulation of the stress generated in the conventional interconnector 1 for connecting solar cells shown in FIG. 13, while FIGS. 2A and 2B show results of analysis obtained by simulation of stress generated in the interconnector 1 of the present embodiment shown in FIG. 1.

In order to solve the problem of the conventional interconnector described above, the inventors first carried out stress analysis of the interconnector 1 having the conventional shape shown in FIG. 13. FIGS. 18A and 18B are stress contours showing the results of analysis by finite method of stress distribution when upper and lower ends of interconnector 1 shown in FIG. 13 are pulled so that the connector is extended by 1 mm in the serial direction, that is, the upward and downward directions of FIG. 18A. It can be seen from the stress contours that generation of stress is concentrated in the periphery of the approximately circular notches 5a and 6a of the closed ends of slits 5 and 6.

Accordingly, it is found from the result of this analysis that the displacement is mainly absorbed by the change of the width of slits 5 and 6, and the generation of stress is concentrated on the vicinity of notches 5a and 6a. Further, from the result of analysis, the inventors have reached a conclusion that even when one or both of the region immediately below slit 5 and the region immediately above slit 6 of the conventional interconnector 1 shown in FIG. 13 is removed, there would be no problem in the function of absorbing displacement.

Figure 2A:
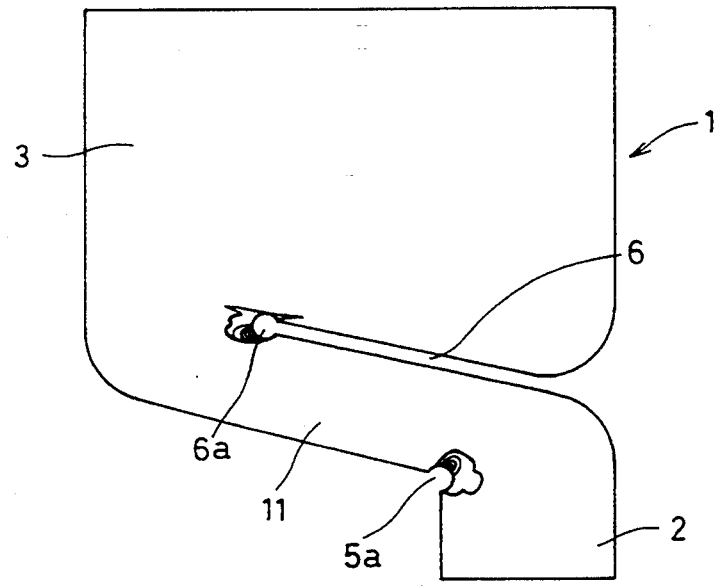
FIG. 2A shows, in the form of stress contour, the result of stress analysis in accordance with finite method of the interconnector in accordance with the first embodiment of the present invention shown in FIG. 1.
Figure 2B:
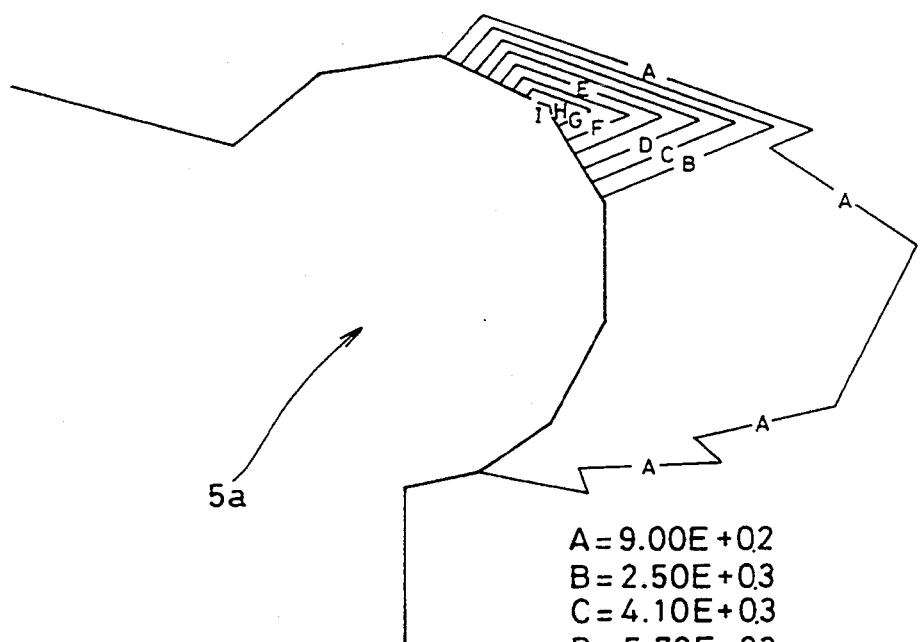
FIG. 2B shows, in enlargement, the vicinity of notch 5a of FIG. 2A.

FIGS. 2A and 2B show the results of analysis of interconnector 1 in accordance with the present invention, which correspond to the results shown in FIGS. 18A and 18B. As can be seen from the results of analysis, even when the front surface connecting portion 2 at the region immediately below the lower end 5c of connector bar 11 is removed as in the present embodiment, the stress generated in the periphery of notch 5a is almost the same as in the prior art example shown in FIGS. 18A and 18B.

The inventors also performed a similar analysis of an interconnector 1 shown in FIG. 1 with the portion immediately above the slit 6 removed completely, and the result was approximately the same as above. From the above described results of analysis, the inventors have confirmed that the function of absorbing displacement is not at all affected even when the portion immediately below the slit 5 and the portion immediately above the slit 6 of the conventional interconnector shown in FIG. 13 are all removed.

In the following, interconnectors having various shapes possible in accordance with the above described results of analysis will be described.

Figure 3A:
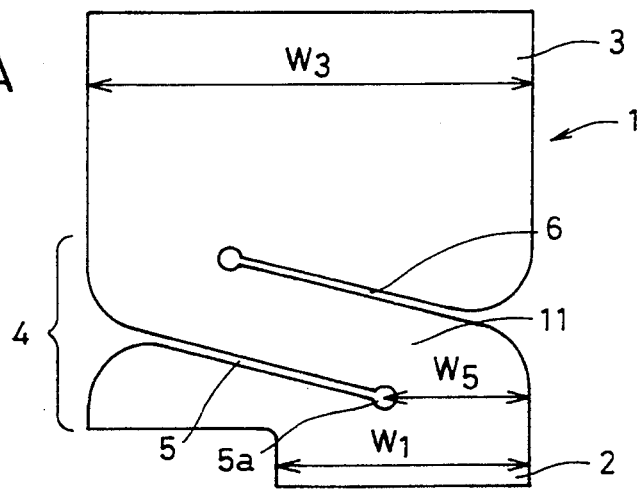
FIG. 3A shows an interconnector for connecting solar cells in accordance with a second embodiment of the present invention.

FIG. 3A shows an interconnector for connecting solar cells in accordance with a second embodiment of the present invention. As compared with interconnector 1 of the first embodiment shown in FIG. 1, in interconnector 1 of this embodiment, the ratio of removal of the portion below the slit 5 is reduced, and the width W1 of front surface electrode connecting portion 2 is made larger than a distance W5 between the center of notch 5a and the right end.

Figure 3B:
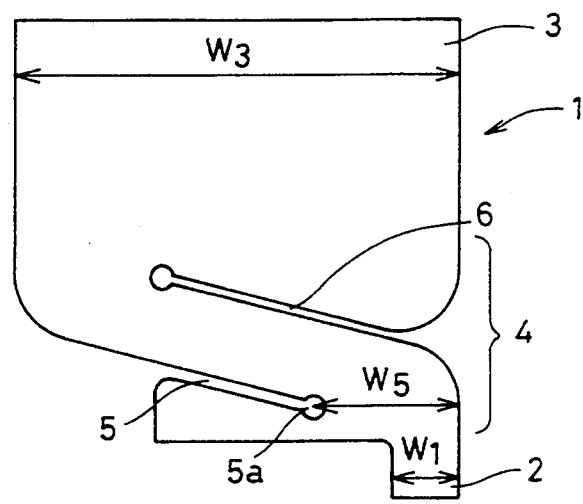
FIG. 3B shows an interconnector for connecting solar cells in accordance with a third embodiment of the present invention.

FIG. 3B shows an interconnector for connecting solar cells in accordance with a third embodiment of the present invention. In interconnector 1 of this embodiment, the ratio of removal of the portion below slit 5 is increased so that W1 is made smaller than W5, as compared with interconnector 1 of the second embodiment shown in FIG. 3A.

Figure 3C:
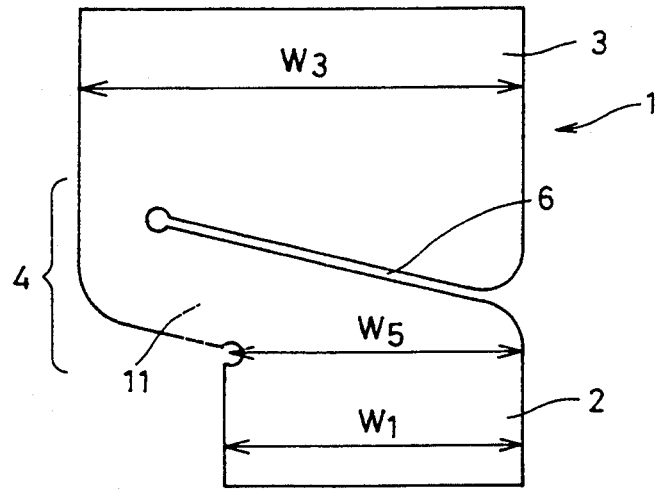
FIG. 3C shows an interconnector for connecting solar cells in accordance with a fourth embodiment of the present invention.

FIG. 3C shows an interconnector for connecting solar cells in accordance with a fourth embodiment of the present invention. Basically, interconnector 1 of this embodiment is similar to the shape of the interconnector 1 of the first embodiment shown in FIG. 1. The interconnector 1 of this embodiment differs from that of FIG. 1 in that the width W5 is increased so as to increase the width of connect bar 11 constituting stress relief portion 4. Since W1 and W5 are made the same, the width W1 is also increased as compared with the embodiment of FIG. 1.

Figure 4A:
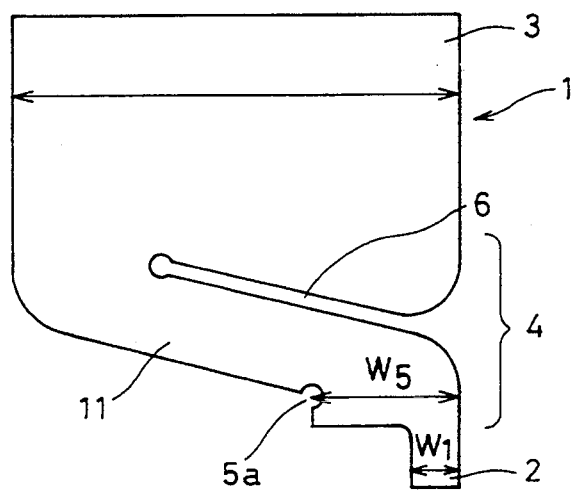
FIG. 4A shows an interconnector for connecting solar cells in accordance with a fifth embodiment of the present invention.

FIG. 4A shows an interconnector for connecting solar cells in accordance with a fifth embodiment of the present invention. Interconnector 1 of this embodiment corresponds to interconnector 1 in accordance with a third embodiment shown in FIG. 3B with the portion immediately below slit 5 removed.

Figure 4B:
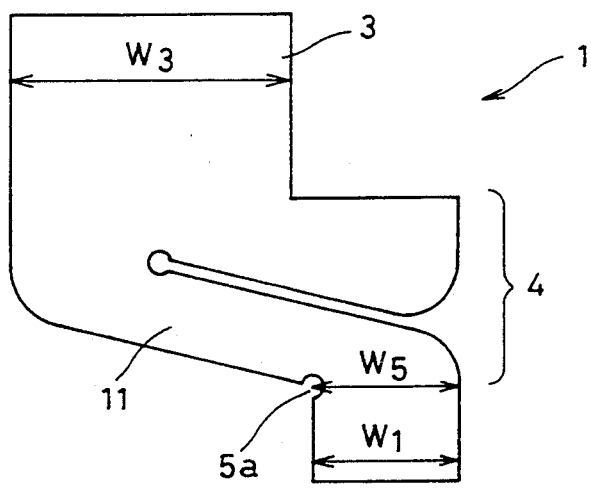
FIG. 4B shows an interconnector for connecting solar cells in accordance with a sixth embodiment of the present invention.

FIG. 4B shows an interconnector for connecting solar cells in accordance with a sixth embodiment of the present invention. In the interconnector 1 of this embodiment, an upper right portion of rear surface electrode connecting portion 3 of interconnector 1 in accordance with the first embodiment shown in FIG. 1 is removed, so that the width W3 of rear surface electrode connecting portion 3 is reduced.

Figure 5A:
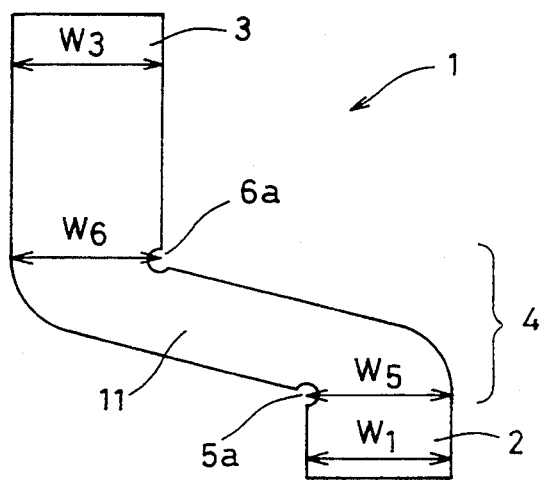
FIGS. 5A, 5B and 5C show three variations of the interconnector for connecting solar cells in accordance with a seventh embodiment of the present invention
Figure 5B:
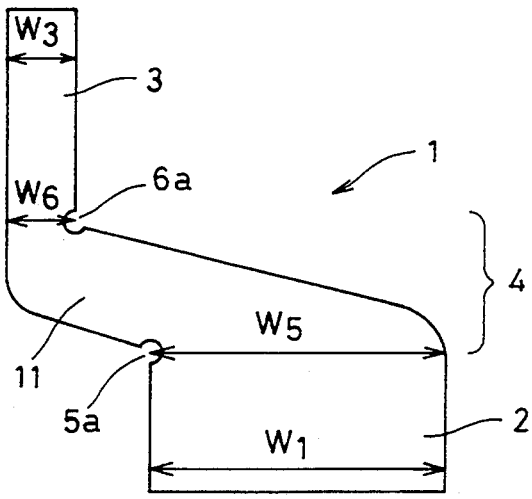
Figure 5C:
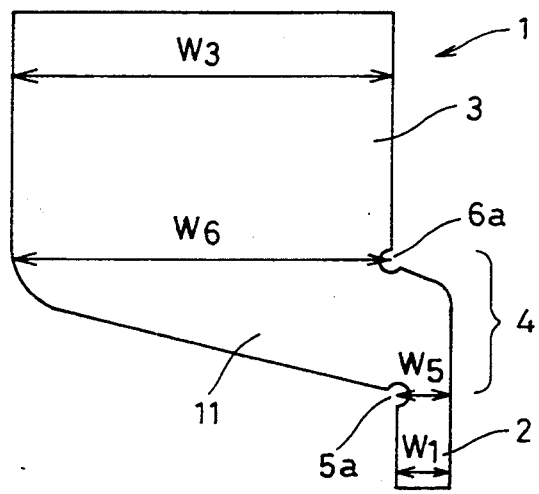

FIGS. 5A, 5B and 5C show three variations of the interconnector for connecting solar cells in accordance with a seventh embodiment of the present invention. Interconnector 1 of this embodiment is common to the interconnectors 1 of the first and fourth embodiments shown in FIGS. 1 and 3C, respectively, in that the width W1 of front surface electrode connecting portion 2 is made the same as W5. Further, in the interconnector 1 of the present embodiment, a portion immediately above slit 6 of the interconnector 1 of FIG. 1 is removed completely, so that the width W3 of rear surface electrode connecting portion 3 is made equal to the distance W6 between the center of notch 6a and the left end. In the three variations shown in FIGS. 5A to 5C, the relation between W1 and W3, that is, relation in magnitude between W5 and W6 is changed relatively, so as to change the width of connect bar 11.

Figure 5D:
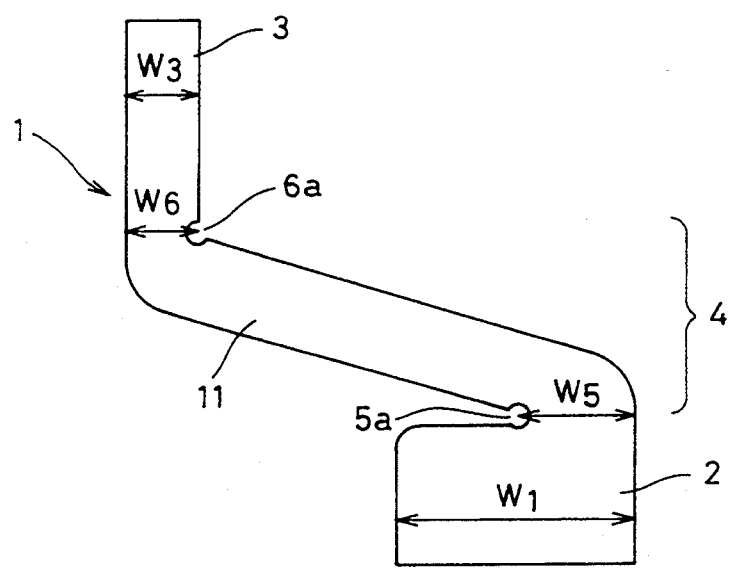
FIGS. 5D and 5E show interconnectors for connecting solar cells in accordance with eighth and ninth embodiments of the present invention.
Figure 5E:
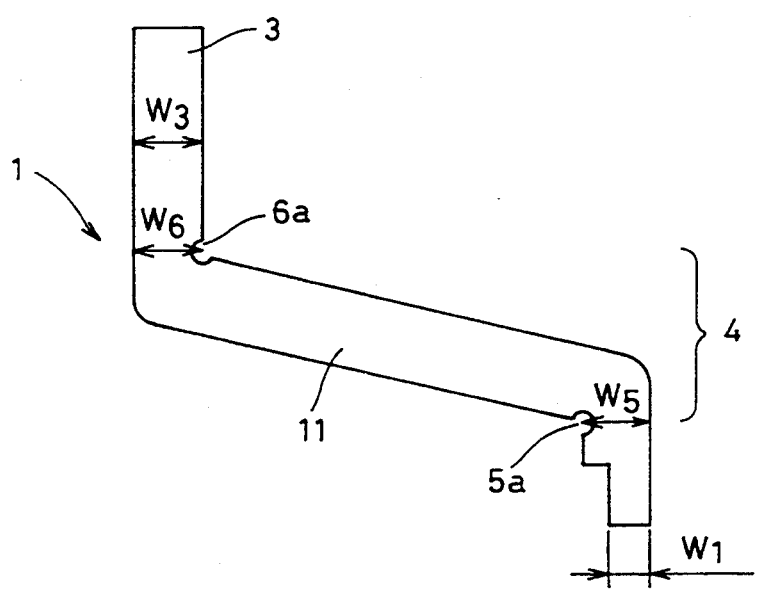

FIGS. 5D and 5E show interconnectors for connecting solar cells in accordance with eight and ninth embodiments of the present invention. In interconnector 1 of the eighth embodiment shown in FIG. 5D, the widths W5 and W6 are further reduced than in the interconnector 1 of the seventh embodiment shown in FIG. 5A so as to further reduce the width of connect bar 11, and the width W1 is made larger than W5. Interconnector 1 of the ninth embodiment shown in FIG. 5E differs from interconnector 1 of the eighth embodiment shown in FIG. 5D in that W1 is made smaller than W5.

Interconnector 1 in accordance with the first to ninth embodiment described above will be compared generally. First, in interconnector 1 in accordance with the second embodiment shown in FIG. 3A, the portion immediately below slit 5 of the region of stress relief portion 4 is unnecessary for the function of absorbing displacement and, when convenience in assembly of solar cells is taken into account, that portion is rather disadvantageous. The interconnector with this portion removed corresponds to the interconnectors 1 in accordance with the first and fifth embodiments shown in FIGS. 1 and 4A, respectively. Therefore, interconnectors 1 of the first and fifth embodiment can be regarded as improvements of interconnector 1 in accordance with the second embodiment. In interconnector 1 in accordance with the third embodiment shown in FIG. 3B also, the region immediately below slit 5 is unnecessary, and in that point, the fifth embodiment shown in FIG. 4A is an improvement over the third embodiment.

Interconnector 1 in accordance with the fourth embodiment shown in FIG. 3C is large in the width of connect bar 11 is increased. However, the capability of absorbing displacement is reduced as compared with the first embodiment. When the first embodiment shown in FIG. 1 is compared with the fifth embodiment shown in FIG. 4A, the first embodiment may be superior in the view point of connection strength at the connecting portion between interconnector 1 and solar cells. In interconnector 1 in accordance with the sixth embodiment shown in FIG. 4B, the region immediately above slit 5 at the region of stress relief portion 4 is not necessary and disadvantageous in its function. An interconnection with that portion removed corresponds to interconnector 1 of the first one of the seventh embodiment shown in FIG. 5A. When three variations of interconnector 1 shown in FIGS. 5A to 5C in accordance with the seventh embodiment are compared with each other, the one shown in FIG. 5A may be superior from the view point of stress absorbing capability, when we compare the width of connect bar 11.

Interconnector 1 in accordance with the eighth embodiment shown in FIG. 5D having its width W1 of front surface electrode connecting portions reduced corresponds to the first one of the interconnector 1 in accordance with the seventh embodiment shown in FIG. 5A or the one in accordance with the ninth embodiment shown in FIG. 5E. When FIGS. 5A and 5E are compared, the interconnector 1 of FIG. 5A which has relatively large width W1 may be superior from the view point of connection strength at the connecting portion between the interconnector 1 and the solar cells. When we compare FIGS. 1 and 5A, interconnector 1 shown in FIG. 1 may be preferable when convenience for connection to rear surface electrode of solar cells is taken in consideration, while the interconnector 1 of FIG. 5A may be preferred in view of the weight of the whole interconnector 1. In view of the foregoing, of the interconnectors 1 in accordance with the first to ninth embodiments, interconnector 1 of the first embodiment shown in FIG. 1 and the first one of the seventh embodiment shown in FIG. 5A would be the most preferred.

Figure 6:
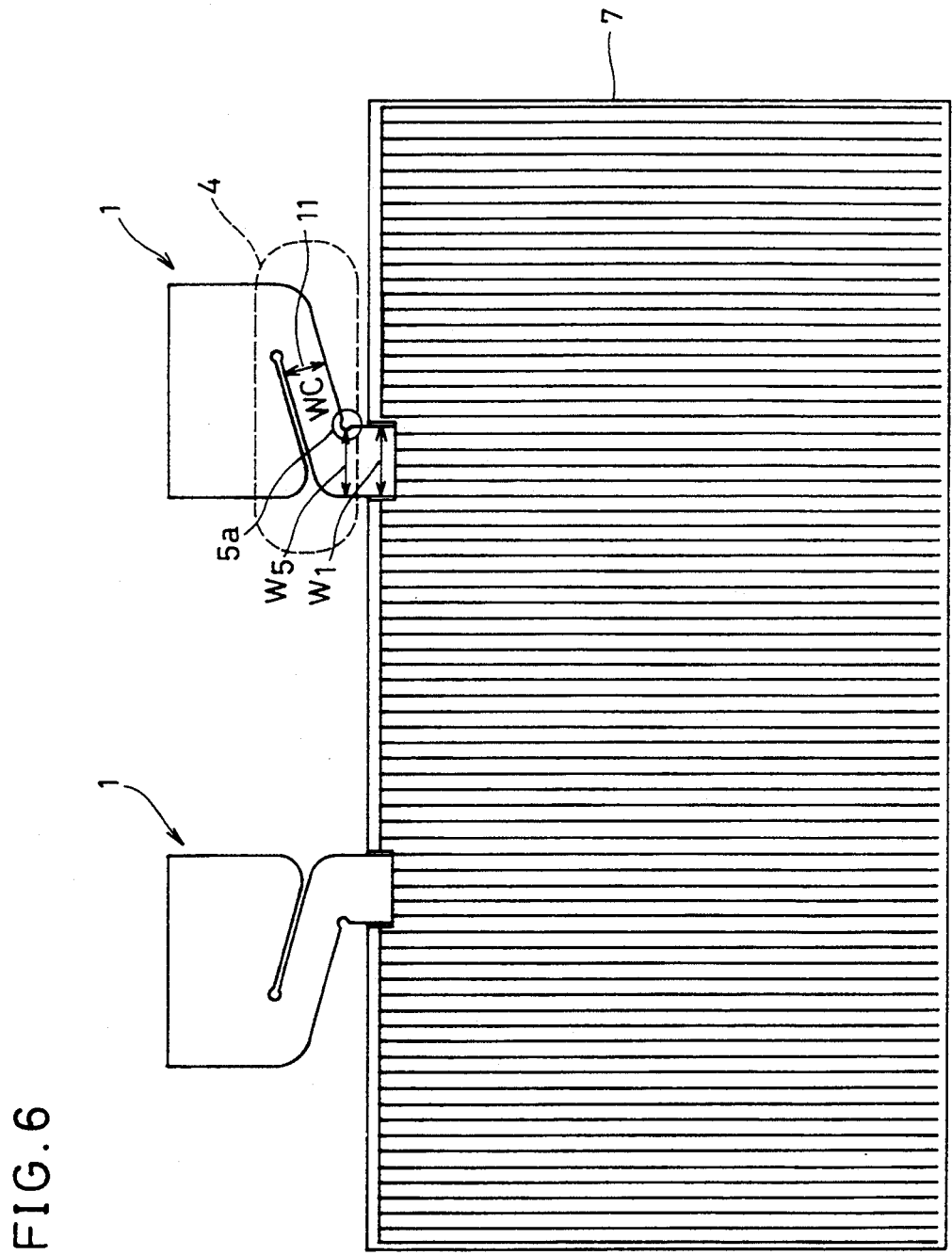
FIG. 6 shows an example of a solar cell employing the interconnector in accordance with the first embodiment of the present invention.

An example of a solar cell employing the interconnector of the present invention will be described. FIG. 6 shows the interconnector 1 in accordance with the first embodiment shown in FIG. 1 connected to solar cells 7. Referring to FIG. 6, the width W1 of a portion of interconnector 1 which is connected to solar cell 7 is made approximately the same or smaller than the width W5 from the center of curvature of the circle of notch 5a to the opposing side. Here, the width W1 of the connecting portion between interconnector 1 and solar cell 7 may be made approximately the same or larger than the width WC of connect bar 11 at stress relief portion 4. However, W1 is made equal to or smaller than W5. The width W6 of connect bar 11 is determined to have a necessary resistance value, dependent on the current value of solar cell 7.

Figure 7A:
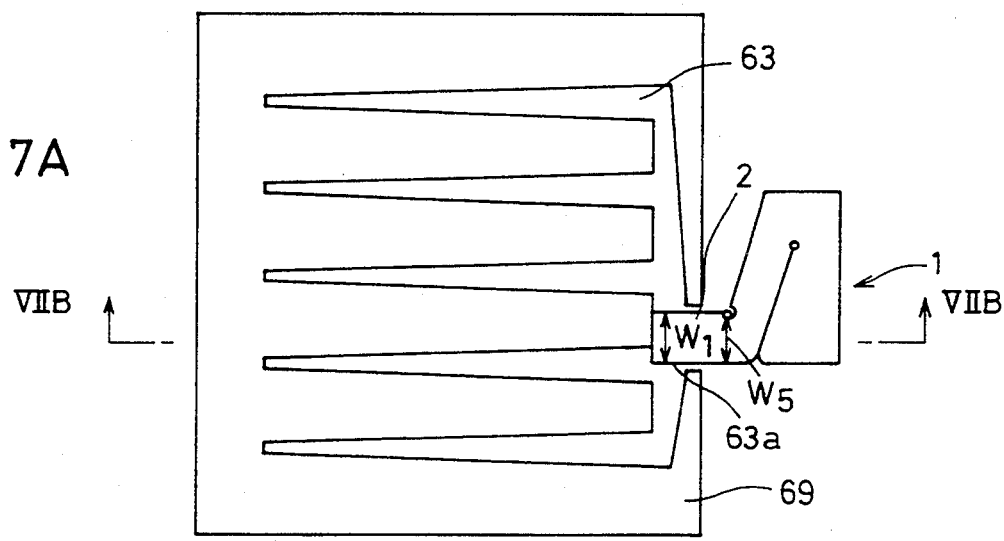
FIG. 7A is a plan view showing detailed structure in the vicinity of the front surface connecting portion at which the interconnector 1 is connected to the solar cell shown in FIG. 6.
Figure 7B:
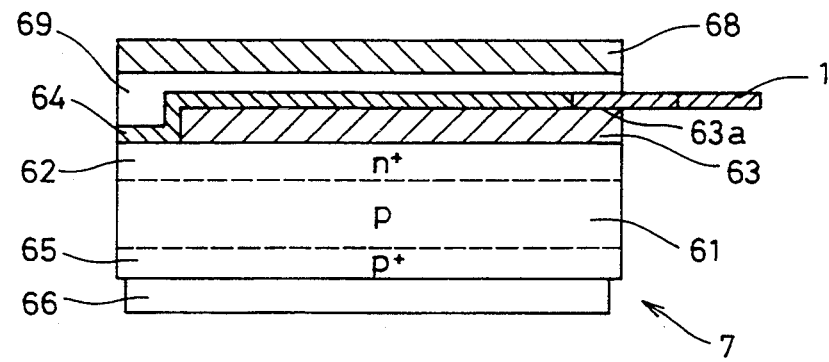
FIG. 7B is a cross section taken along the line VIIB—VIIB of FIG. 7A.
Figure 8:
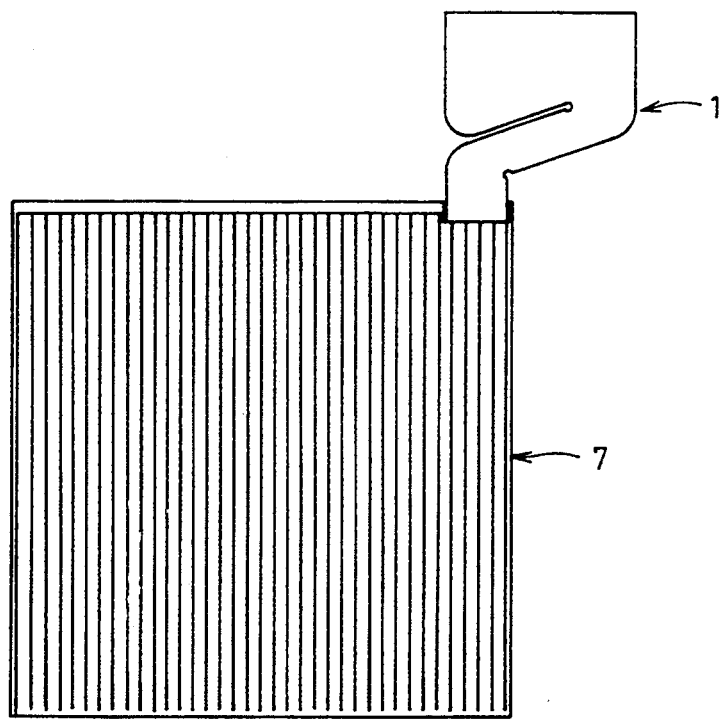
FIG. 8 shows another example of the solar cells with interconnector using the interconnector in accordance with the first embodiment of the present invention.

FIGS. 7A and 7B are a plan view and a side view of solar cell 7 shown in FIG. 6, respectively, showing the details of the structure, and FIG. 7B is a cross section taken along the line VIIB—VIIB of FIG. 7A. Referring to FIGS. 7A and 7B, front surface electrode connecting portion 2 of interconnector 1 is connected to an electrode pad 63a of a surface electrode 63 of solar cell 7.

Figure 14A:
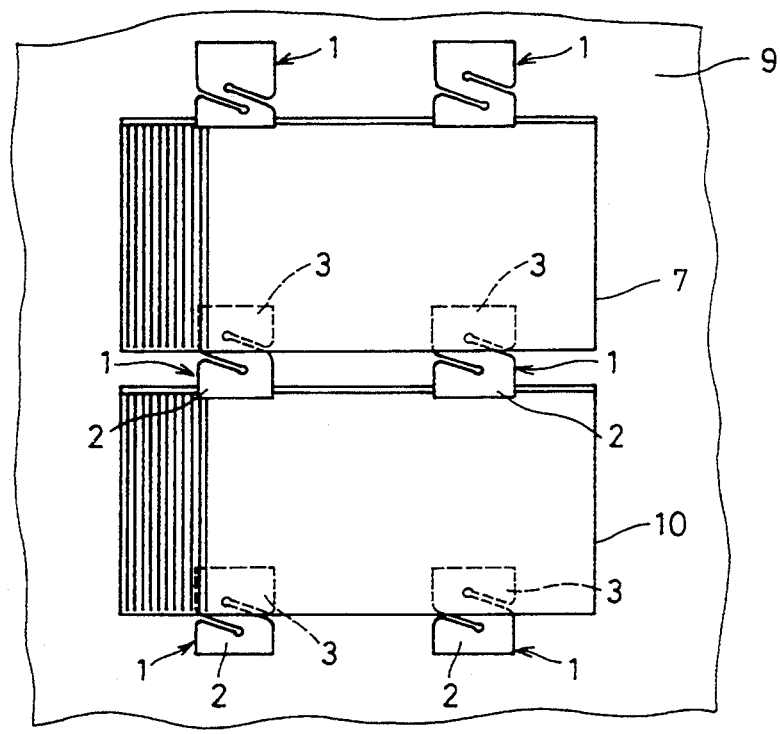
FIG. 14A is a plan view showing connection of solar cells by the conventional interconnector shown in FIG. 13.
Figure 14B:
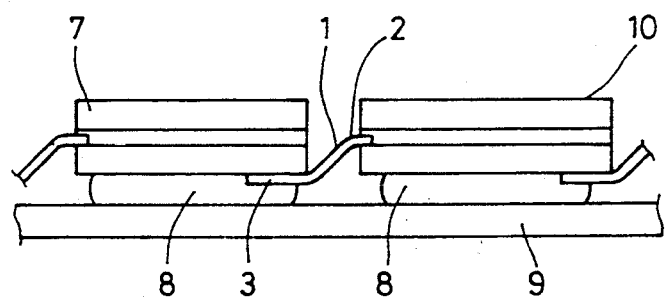
FIG. 14B is a left side view of the solar cell shown in FIG. 14A.
Figure 15:
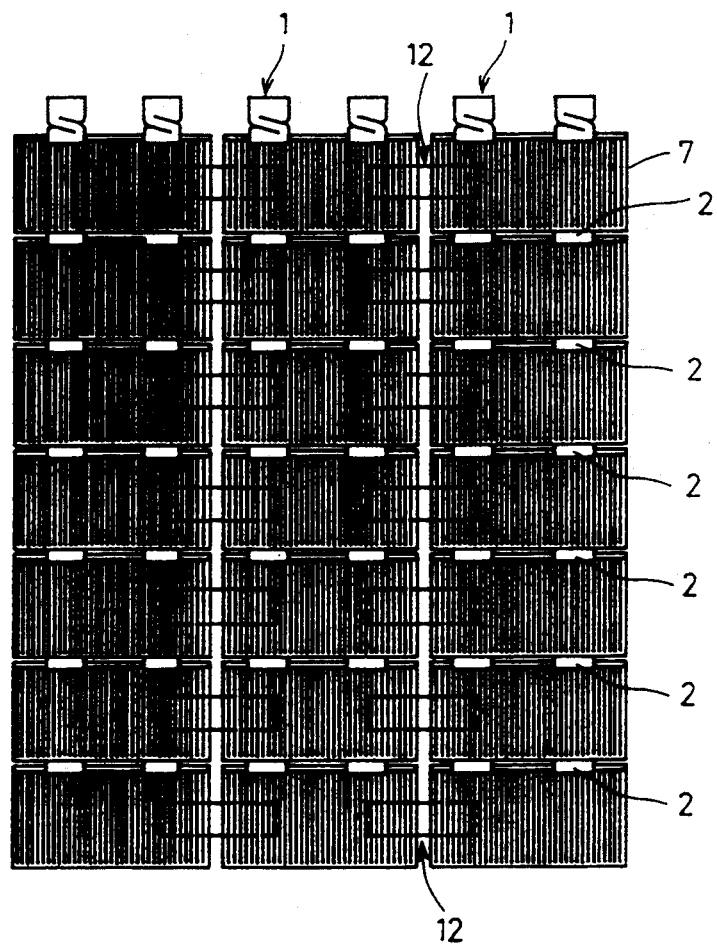
FIG. 15 is a plan view showing connection of solar cells in the serial and parallel directions by using the conventional interconnector shown in FIG. 13 and the conventional interconnector for parallel connection.
Figure 16:
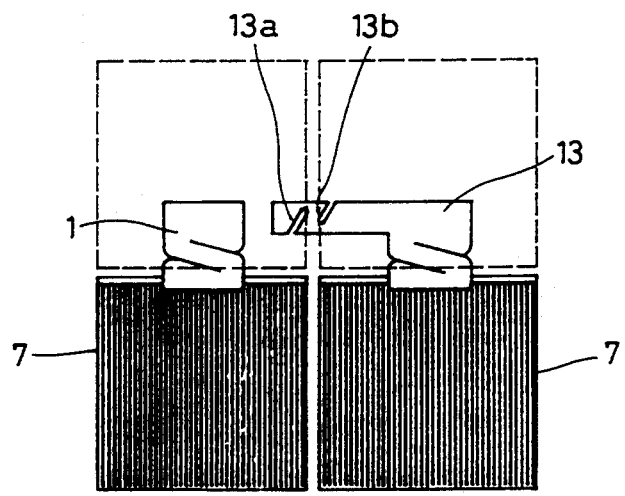
FIG. 16 is a plan view showing solar cells connected in serial and parallel directions by using, in addition to the conventional interconnectors for serial connection only, the conventional interconnectors 13 used both for serial and parallel connections.

The solar cell 7 shown in FIGS. 7A and 7B are generally manufactured in the following manner. By thermally diffusing n type impurities on the surface of a p type silicon substrate having the thickness of about 50 to about 200 μm, an n+region 62 is formed, and by thermally diffusing p type impurities in the rear surface, a p+region 65 is formed on the entire surface. A front surface electrode 63 and a rear surface electrode 66 which have comb shape for taking generated power are formed on n+region 62 of the front surface and p+region 65 of the rear surface, respectively. The light receiving surface on which surface electrode 63 is formed is covered by a refraction preventing film 64 in order to reduce surface reflection of incident light. On surface electrode pad portion 63a, interconnector 1 for taking out power is welded, and a cover glass 68 is welded further on the surface of solar cell 7 with a resin 69 interposed. Interconnector 1 is used for connecting solar cells with each other and to assemble a solar cell module. The solar cell module including a plurality of solar cells 7 assembled is approximately the same as the conventional one shown in FIGS. 14A, 14B and 15, basically.

However, since the width W1 of front surface electrode connecting portion 2 of interconnector 1 is made smaller in solar cells shown in FIGS. 7A and 7B, the area of the front surface electrode of solar cell 7 is made smaller. Consequently, effective light receiving area of solar cell 7 is made larger relatively, improving efficiency in generating power of solar cell 7.

Now, an example of the improved efficiency of power generation of a silicon BSFR type solar cell having the length of 2 cm, width of 4 cm and the thickness of 50 μm to which the interconnector 1 of the first embodiment of the present invention shown in FIG. 1 is applied will be described. Conventionally, the width W1 of front surface electrode connecting portion 2 was about 8 mm. By contrast, in the interconnector of the first embodiment, the width can be reduced to 2.7 mm. Consequently, not only the short current but open voltage could be increased, and the maximum output of generated power was increased by about 4.6 mW as compared with the example employing the conventional interconnector, resulting in the power of 159.4 mW. This means an increase of about 3% with respect to the output of the conventional solar cell. These values are measured values under the condition of 135.5 mW/cm$^2$, 28° C., using solar simulator AMO.

In order to examine connection strength of the solar cell to which the interconnector in accordance with the first embodiment of the present invention is applied, a tensile strength test of 45° was effected for three solar cells of the BSR 200 μm (2×2 cm$^2$) cell type having the size of 2.7×0.85 mm$^2$ after connecting an interconnector in accordance with the first embodiment to each of he three solar cells. The results were as shown in Table 1 below.

As can be seen from Table 1, the minimum value of the tensile strength of the three solar cells was 816 g, which satisfy the specification of the tensile strength for the conventional solar cell, that is, at least 500 g. In other words, it was found that the connection strength of the present invention was as good as that of the conventional interconnector.

TABLE 1

| Cell No. | Tensile Strength (g) | Break Mode |
| --- | --- | --- |
| 1 | 816 | Cell Broken |
| 2 | 952 | Cell Broken |
| 3 | 1120 | Interconnector Disconnected |
| Average | 963 | — |

As described above, by the solar cell employing the interconnector of the present invention, the efficiency in generating power can be significantly improved with maintaining connection strength at a level on which no problem is caused. Therefore, as the amount of power generation per unit area increases in the future in the attempt of improving the efficiency of the solar cells, the effect provided by the present invention will be of much importance.

Figure 9:
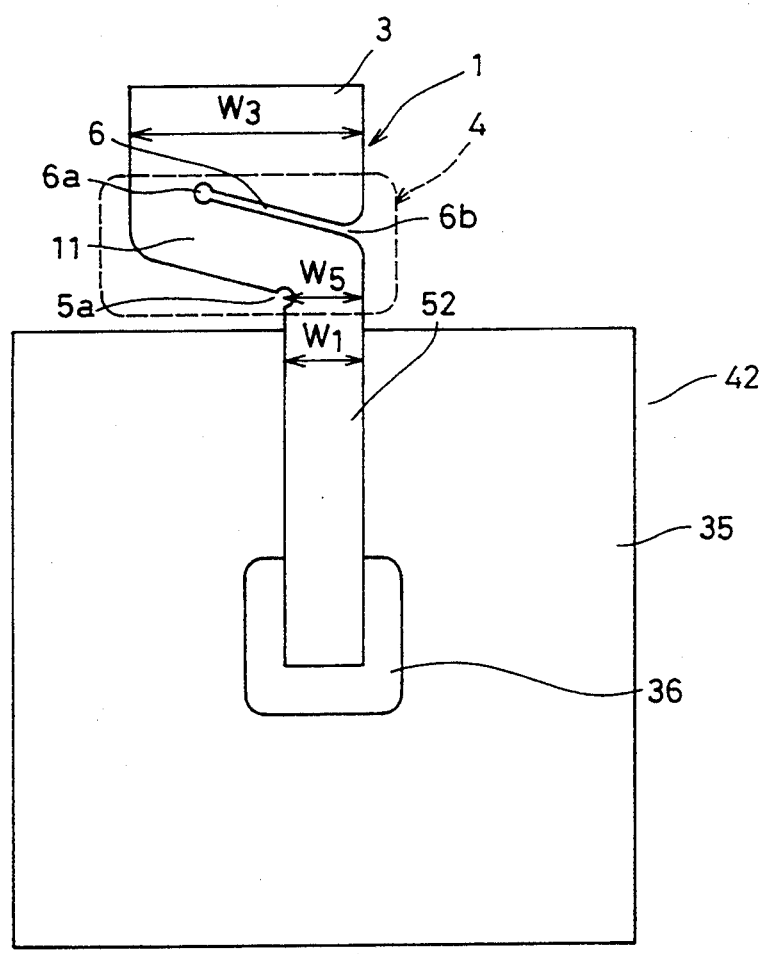
FIG. 9 shows an example of a diode with interconnectors using the interconnector in accordance with the first embodiment of the present invention.
Figure 17A:
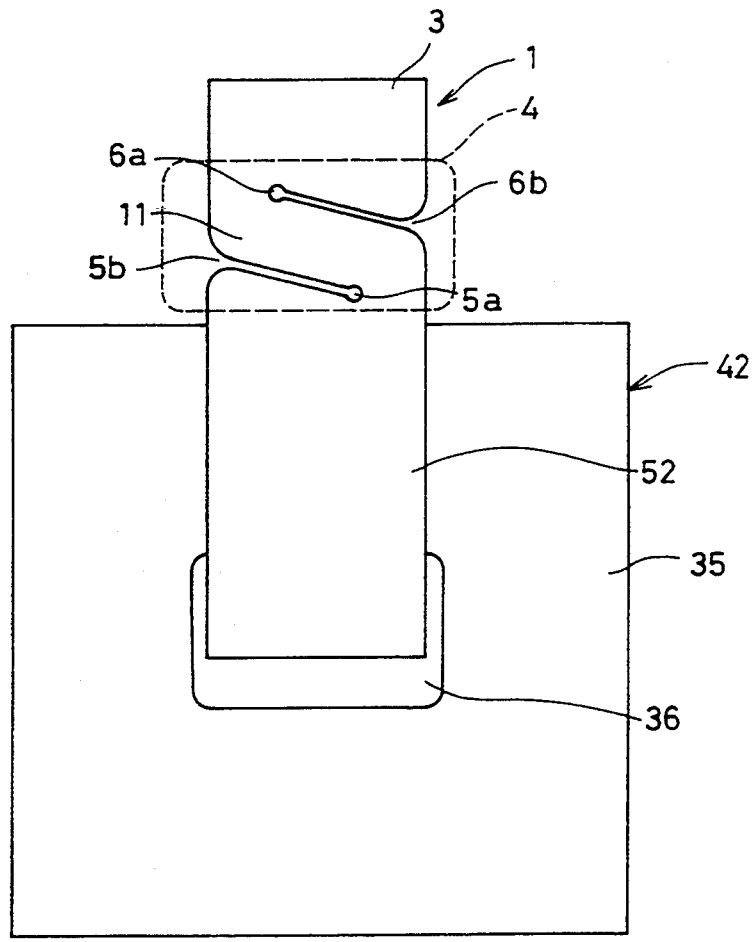
FIG. 17A is a plan view showing a diode with an interconnector employing the conventional interconnector having similar shape as the conventional interconnector shown in FIG. 13.
Figure 17B:
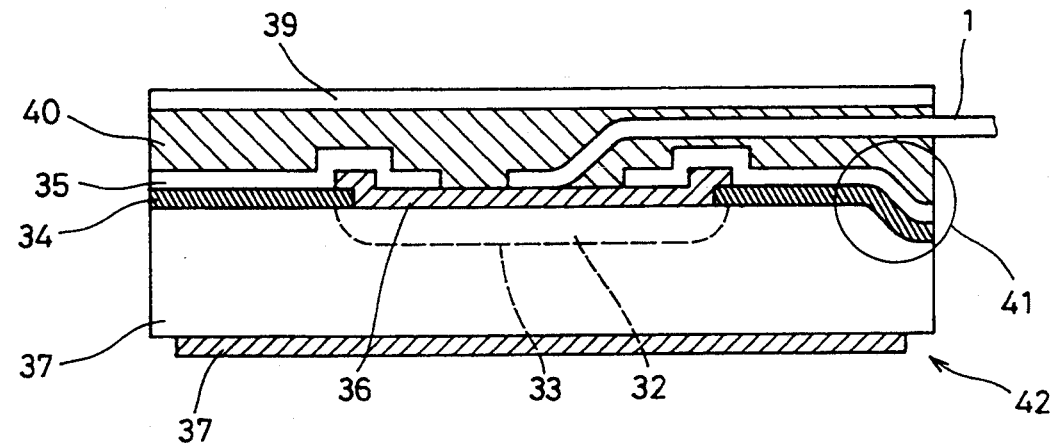
FIG. 17B is a cross section thereof.

Now, a diode employing the interconnector of the present invention will be described. FIG. 9 is a plan view showing an example of a diode with the interconnector, to which interconnector 1 of the first embodiment of the present invention is applied. The cross section thereof is omitted, since it is the same as FIG. 17B. The diode with the interconnector shown in FIG. 9 differs from the prior art example shown in FIGS. 17A and 17B in that the size of the electrode 36 of the diode and the shape of the interconnector 1 are different. As compared with the conventional structure, the size of the connecting piece 52 of interconnector 1 and the area of exposed portion of electrode 36 are reduced. The width W1 of the connecting piece 52 of interconnector 1 which is connected to electrode 36 of diode 42 is made smaller than the width W3 of connecting portion 3 between the adjacent diode. At the connecting portion 3, there is provided a slit 6, and a diagonal connect bar 11 is formed. At the left hand of the interface between connect bar 11 and connecting piece 52, approximately circular notch 5a is provided. Slit 6 and connect bar 11 constitute a stress relief portion 4. As for the relation between distance W5 from the center of curvature of the approximately circular notch 5a to the right end of stress relief portion 4 and the width W1 of connecting piece 52, W1 is approximately the same as W5 in the example shown in FIG. 9. However, W1 may be made smaller than W5.

The width of connect bar 11 is approximately the same as W5, which width is determined in accordance with the rated current value of the diode.

It has been confirmed by computer simulation that there is not a significant difference between each of the position of concentration of stress and the value of stress between the interconnector having the shape of FIG. 9 and conventional interconnector having the shape of FIG. 13.

Figure 10:
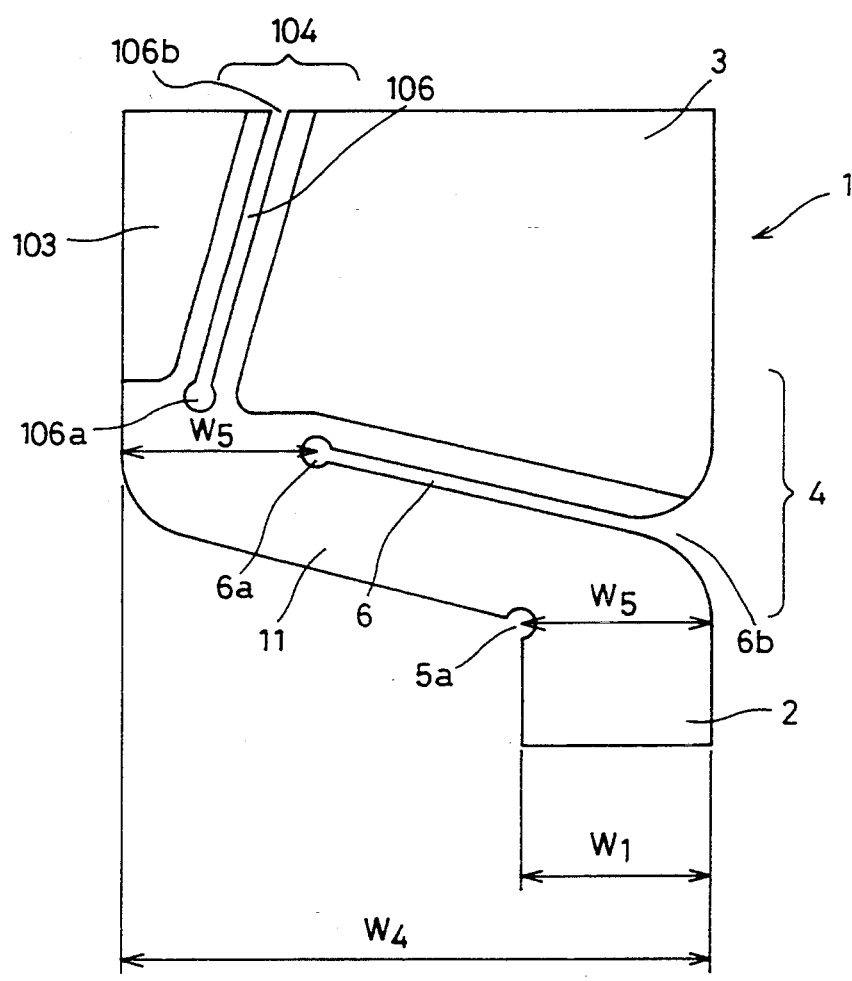
FIG. 10 shows an interconnector for connecting solar cells in accordance with an tenth embodiment of the present invention.

An interconnector for connecting solar cells in accordance with a tenth embodiment of the present invention will be described. The interconnector of the present embodiment is used for connecting a plurality of solar cells both in the serial and parallel directions. Referring to FIG. 10, the interconnector 1 for connecting solar cells includes a front surface electrode connecting portion 2 connected to a front surface electrode of a first solar cell, a rear surface electrode connecting portion 3 connected to a rear surface electrode of a second solar cell which is adjacent in the serial direction to the first solace cell, another rear surface electrode connecting portion 103 connected to a rear surface electrode of a third solar cell adjacent in parallel direction to the second solar cell, a stress relief portion between front surface electrode connecting portion 2 and a rear surface electrode connecting portion 3, and a stress relief portion 104 between rear surface electrode connecting portion 3 and rear surface electrode connecting portion 103. Rear surface electrode connecting portions 3 and 103 as well as the front surface electrode connecting portion 2 have, preferably, a mesh structure.

The first stress relief portion 4 has a plate structure, and on the side of rear surface electrode connecting portion 3 of the first stress relief portion 4, there is formed a slit 6. The second stress relief portion 104 also has a plate structure, and a slit 106 is formed between rear surface electrode connecting portions 3 and 103 so as to extend a direction crossing, in the orthogonal direction, for example, the direction of extension of slit 6.

The width W4 of the entire interconnector 1 including rear surface electrode connecting portions 3 and 103 is the same as the width of the first stress relief portion 4. The distance between the center of notch 6a at the closed end of slit 6 from the left end of interconnector 1 and the distance between the center of an approximately circular notch 5a formed at the left end of the interface between front surface electrode connecting portion 2 and connect bar 11 formed at the first stress relief portion 4 and the right end of the first stress relief portion 4 are both W5. The width W1 of front surface electrode connecting portion 2 is made smaller than the width of rear surface electrode connecting portion 3.

Figure 11:
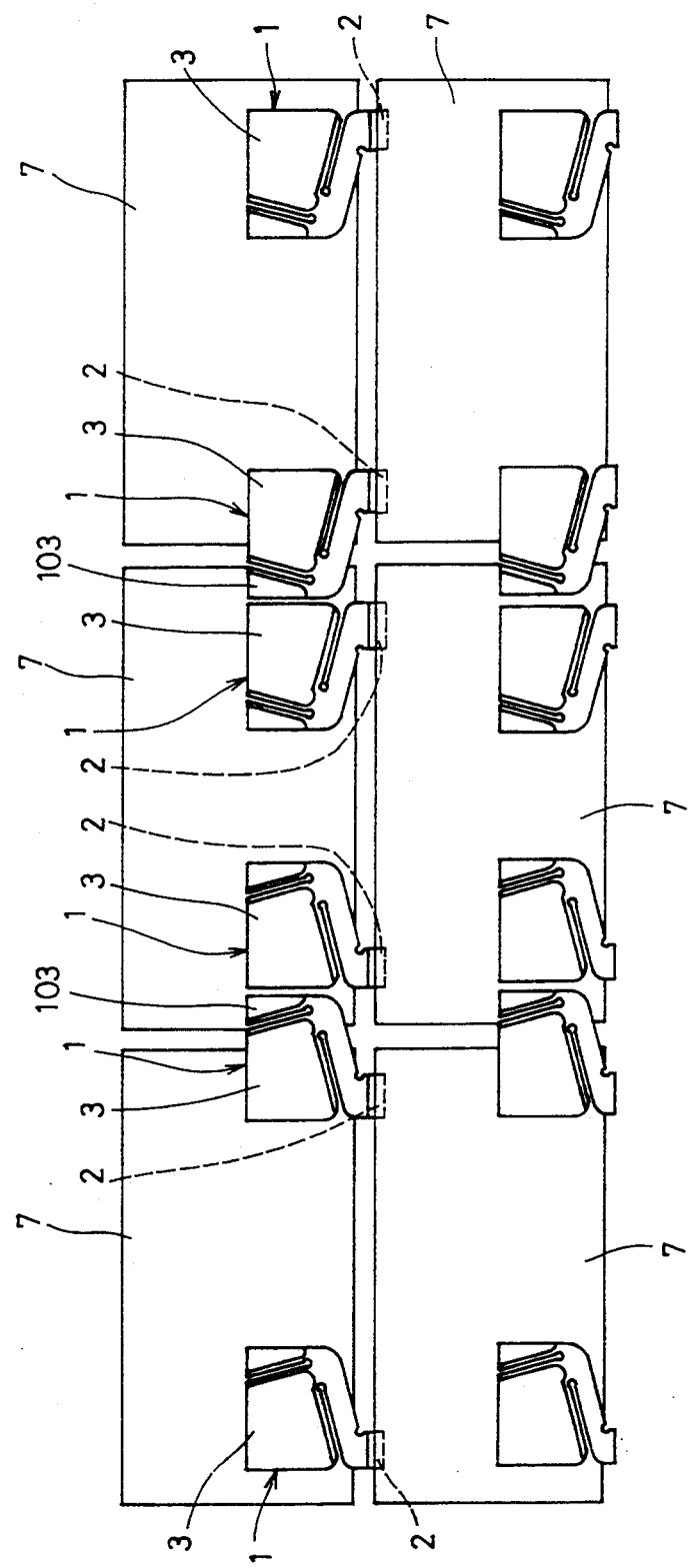
FIG. 11 shows a plurality of solar cells connected in parallel and serial directions by the interconnectors in accordance with the tenth embodiment shown in FIG. 10.

FIG. 11 shows solar cells viewed from the rear surface side, when solar cells are connected in serial and parallel directions by using the interconnector 1 for connecting solar cells in accordance with the tenth embodiment shown in FIG. 10. Among the interconnector 1 for connecting solar cells having the shape shown in FIG. 11, those connected only to two solar cells 7 are used for connection of solar cells 7 in the serial direction only, while those connected to three solar cells 7 are used for connection both in the serial and parallel directions. In the interconnector 1 used for connection both in the serial and parallel directions, front surface electrode connecting portion 2 is connected to a front surface electrode of one solar cell 7, rear surface electrode connecting portion 3 is connected to the rear surface electrode of another solar cell 7, and rear surface electrode connecting portion 103 is connected to a rear surface electrode of a still another solar cell 7.

As described above, the interconnector 1 for connecting solar cells in accordance with the tenth embodiment shown in FIG. 10, which has approximately similar contour of the interconnector 1 of the first embodiment shown in FIG. 1, enables connection both in the parallel and serial directions. Therefore, without sacrificing the advantage of interconnector 1 in accordance with the first embodiment, it is not necessary to prepare a separate interconnector even when solar cells connected in the serial direction are to be further connected in the parallel direction. Therefore, it is not necessary to increase the number of parts of the solar paddle. Since a stress relief portion 104 for absorbing displacement between solar cells connected in parallel directions and a rear surface electrode connecting portion 103 are provided for parallel connection, the width W4 of the whole interconnector 1 is not much increased as compared with the first embodiment shown in FIG. 1. Therefore, handling is easy and the cost for assembly is not increased. Further, the displacement generated between solar cells connected in the serial and parallel directions generated when the cells are used in space, for example, can be absorbed by two stress relief portions 4 and 104. Therefore, even when they are used as solar cells for artificial satellite, reliability thereof such as life length of the interconnector against fatigue is as long as the conventional interconnector shown in FIG. 13.

Figure 19:
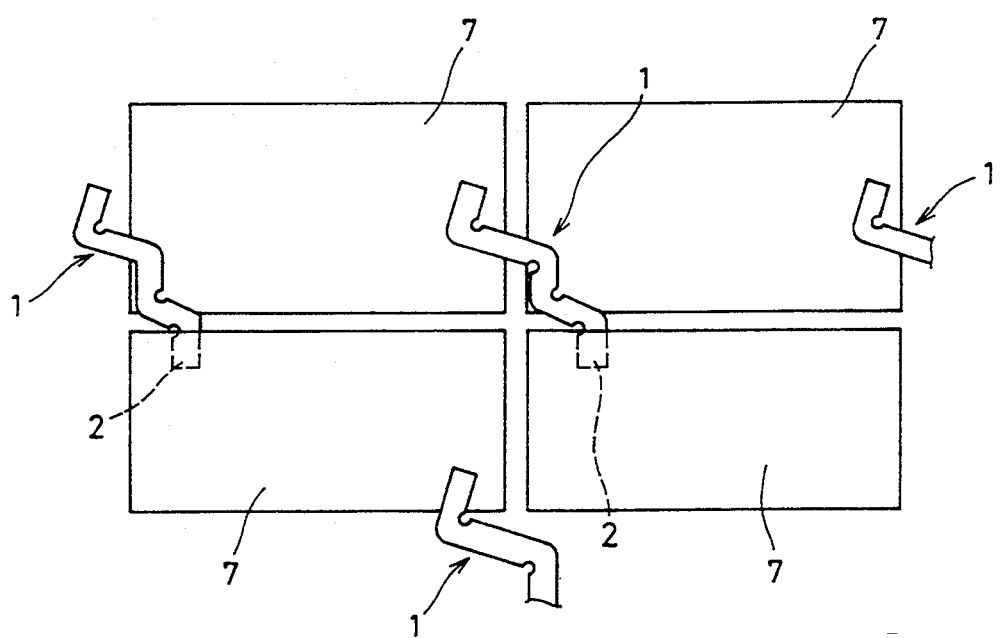
FIG. 19 is a plan view showing connection of solar cells in the serial and parallel directions by using the interconnector of the twelfth embodiment of the present invention shown in FIG. 12B.

Modifications of the interconnector in accordance with the first embodiment shown in FIG. 10 will be described with reference to FIGS. 12A and 12B. Interconnector 1 shown in FIG. 12A corresponds to the interconnector 1 shown in FIG. 10 with the front surface electrode connecting portion 2 in the region which is immediately above slit 6 at stress relief portion 4 removed. Interconnector 1 in accordance with the twelfth embodiment of the present invention shown in FIG. 12B has upper half of the interconnector 1 in accordance with the eleventh embodiment of FIG. 12A further modified. The modification of the tenth embodiment into the twelfth embodiment approximately corresponds to that of the first embodiment into the seventh embodiment as shown in FIG. 5A, and the interconnector 1 of the twelfth embodiment is connected to solar cells 7 as shown in FIG. 19. The shape of the interconnector 1 shown in FIG. 12B is complicated, however, it has advantages of being able to be used for connecting solar cells in both serial and parallel directions and having no slits which would easily get caught on the end portions of solar cells.

Figure 12A:
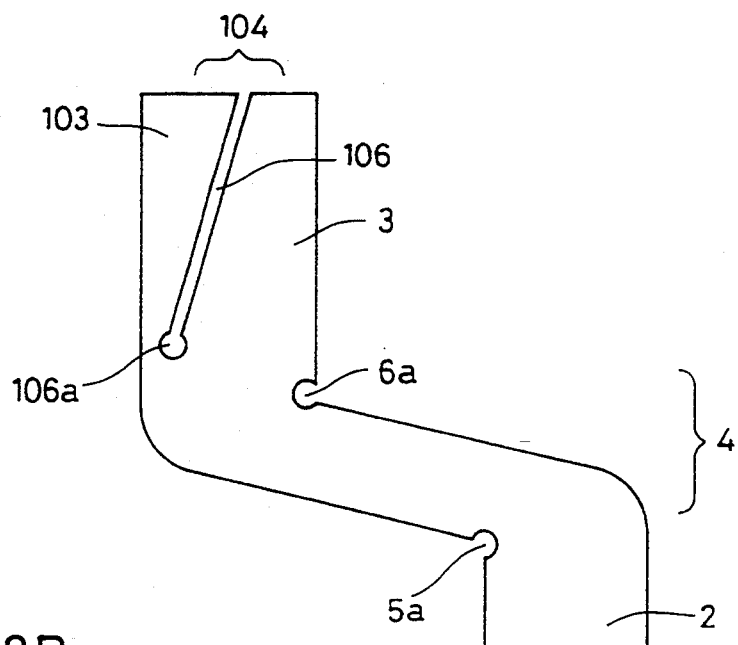
FIG. 12A shows an interconnector for connecting solar cells in accordance with a eleventh embodiment of the present invention.
Figure 12B:
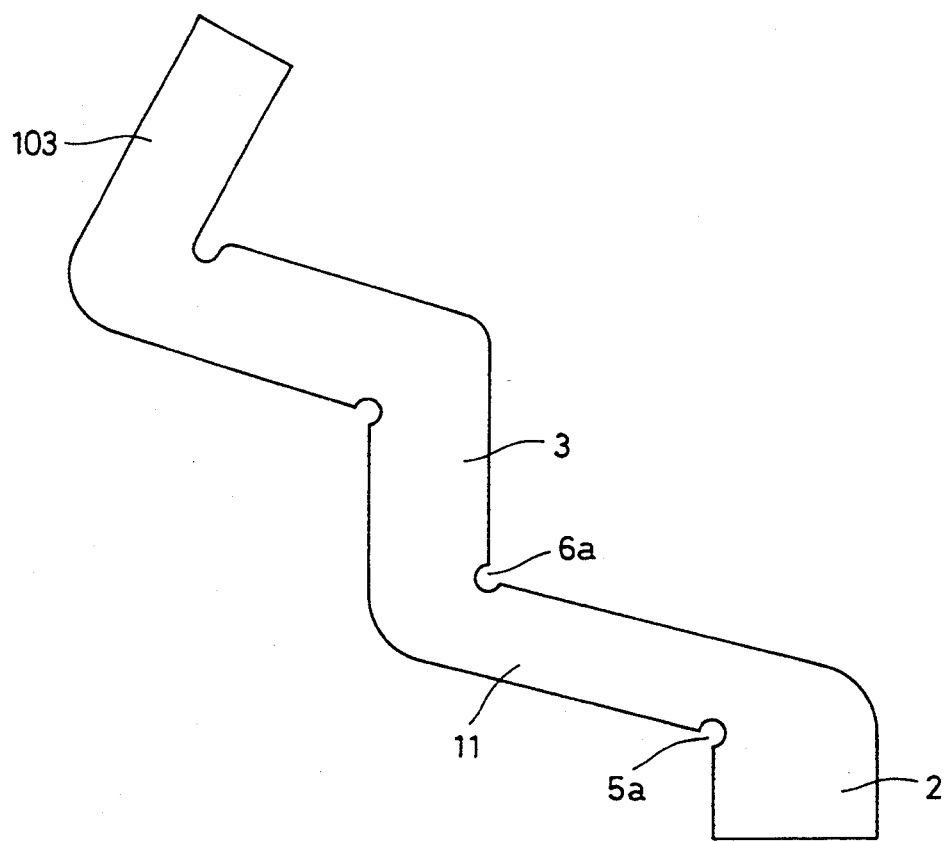
FIG. 12B shows an interconnector for connecting solar cells in accordance with a twelfth embodiment of the present invention.

The interconnectors 1 in accordance with the eleventh and twelfth embodiment shown in FIGS. 12A and 12B are superior to the interconnector of the tenth embodiment in that their weight is reduced. However, the area of rear electrode connecting portion 3 is little reduced, the planar shape is slender and it is bent in a complicated manner. Therefore, convenience in handling may be little inferior to that of interconnector 1 in accordance with the tenth embodiment.

The interconnectors in accordance with the various embodiments of the present invention described above are intended to absorb stress generated because of temperature cycle having large difference especially in space by planar deformation of stress relief portion and to assure electric connection between solar cells. Therefore, the interconnectors are common to, for example, hinges for doors, connecting fittings for opening/closing door, flexible tubes for connecting tubes only in that they are all members for connection. The objects and functions of the interconnectors of the present invention are basically quite different from those mentioned above.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An interconnector of a metal plate type for electrically connecting electronic device elements in a serial direction or in a parallel direction orthogonal to the serial direction, comprising:
   a first connecting portion connected to a front surface electrode of a first electronic device element;
   a second connecting portion connected to a rear surface electrode of a second electronic device element adjacent in the serial direction to said first electronic device element; and
   a first stress relief portion for absorbing displacement generated between said first connecting portion and said second connecting portion; wherein
   width of said first connecting portion in said parallel direction is made smaller than the width of said first stress relief portion in said parallel direction.

2. The interconnector according to claim 1, wherein the width of said first connecting portion in said parallel direction is approximately the same as the width of said second connecting portion in said parallel direction.

3. The interconnector according to claim 1, wherein the width of said first connecting portion in said parallel direction is smaller than the width of said second connecting portion in said parallel direction.

4. The interconnector according to claim 3, wherein said first stress relief portion includes a slender portion extending from a region near one side which is continuous to said first connecting portion to a region near the other end which is continuous to said second connecting portion with a prescribed angle of inclination with respect to said parallel direction.

5. The interconnector according to claim 1, wherein said first stress relief portion includes a slender portion extending from a region near one side which is continuous to said first connecting portion to a region near the other end which is continuous to said second connecting portion with a prescribed angle of inclination with respect to said parallel direction.

6. The interconnector according to claim 5, wherein the width of said first connecting portion in said parallel direction is approximately the same as the width of said slender portion in said parallel direction at an interface with said first connecting portion.

7. The interconnector according to claim 5, wherein the width of said first connecting portion in said parallel direction is larger than the width of said slender portion in said parallel direction at the interface with said first connecting portion.

8. The interconnector according to claim 5, wherein the width of said first connecting portion in said parallel direction is smaller than the width of said slender portion in said parallel direction at the interface with said first connecting portion.

9. The interconnector according to claim 5, wherein at least one of ends of the slender portion extending in a longitudinal direction constitutes a slit extending along said slender portion and having an open end at either one side of said first stress relief portion.

10. The interconnector according to claim 9, wherein said slit includes an approximately circular notch having a diameter which is larger than the width of said slit at an end opposite to said open end.

11. The interconnector according to claim 5, wherein said first connecting portion has an approximately equal width as said slender portion in said parallel direction at the interface with said first connecting portion, and
of ends extending in the longitudinal direction of said slender portion, the end on the side of said second connecting portion constitutes a slit extending along said slender portion and having an open end at one of side ends of said stress relief portion which is closer to said first connecting portion than the other side end of the first stress relief portion.

12. The interconnector according to claim 11, wherein
a continuous interface portion between said slender portion and said first connecting portion has one side end of said first stress relief portion as one end, and has a prescribed width which is smaller than the width of said first stress relief portion,
approximately circular notches each having diameter larger than the width of said slit are provided respectively at the other end of said interface portion where said slender portion continues said first connecting portion and at the closed end opposite to the open end of said slit, and
the width of said first connecting portion in said parallel direction is approximately the same as the distance between the center of said approximately circular notch provided at the other end of said interface and said one side end of said first stress relief portion.

13. The interconnector according to claim 1, further comprising a third connecting portion connected to a rear surface electrode of a third electronic device element adjacent to said second electronic device element in said parallel direction, wherein
a second stress relief portion is provided between said second connecting portion and said third connecting portion for absorbing displacement generated between said second connecting portion and said third connecting portion, and
the width in said parallel direction of a region including said second connecting portion and said third connecting portion is approximately the same as the width of said first stress relief portion in the parallel direction.

14. The interconnector according to claim 13, wherein
a first slit extending with a prescribed angle of inclination with respect to said parallel direction is formed at said first stress relief portion, and a second slit extending approximately orthogonal to said first switch is provided at said second stress relief portion.

15. The interconnector according to claim 14, wherein
said first and second slits each include an open end and a closed end, said closed end including an approximately circular notch having a diameter which is larger than the width of said each slit.

16. An electronic device element with an interconnector, comprising:
an element body portion,
a front surface electrode provided on said element body portion, and
an interconnector connected to said front surface electrode, wherein
said interconnector includes
a first connecting portion connected and fixed to the front surface electrode,
a second connecting portion connected to a rear surface electrode provided on another element body portion adjacent in serial direction to said element body portion, and
a first stress relief portion formed between said first connecting portion and said second connecting portion for absorbing displacement generated between said first connecting portion and said second connecting portion,
the width of said first connecting portion in said parallel direction being smaller than the width of said first stress relief portion in said parallel direction.

17. The electronic device element with an interconnector according to claim 16, wherein
said electronic device element is a solar cell.

18. The electronic device element with an interconnector according to claim 16, wherein
said electronic device element is a diode.

19. The electronic device element with an interconnector according to claim 16, wherein
connection between said first connecting portion and the front surface electrode of said first electronic device element and connection between said second connecting portion and the rear surface electrode of said second electronic device element are effected by welding.

20. The electronic device element according to claim 16, wherein
connection at respective junction portions between said first connecting portion and the front surface electrode of said first electronic device element and between said second connecting portion and the rear surface electrode of said second electronic device element is effected by soldering.

21. The electronic device element was an interconnector according to claim 16, wherein
the width of said first connecting portion in said parallel direction is approximately the same as the width of said second connecting portion in said parallel direction.

22. The electronic device element with an interconnector according to claim 16, wherein
said first stress relief portion includes a slender portion extending from a region near one side end which is a region continuous to said first connecting portion to a region near the other side end which is continuous to said second connecting portion with a prescribed angle of inclination with respect to said parallel direction.

23. The electronic device element with an interconnector according to claim 16, wherein
at least one of the ends extending in the longitudinal direction of said slender portion constitute a slit extending along said slender portion and having an open end at either one side of said first stress relief portion.

24. The electronic device element with an interconnector according to claim 16, wherein
said interconnector further includes a third electronic device element adjacent in said parallel direction to said second device element, and a third connecting portion connected to a rear surface electrode of the third electronic device element,
a second stress relief portion for absorbing displacement generated between said second connecting portion and said third connecting portion is provided between said second connecting portion and said third connecting portion, and
the width in said parallel direction of a region including said second connecting portion and said third connecting portion is approximately the same as the width of said first stress relief portion in the parallel direction.

* * * * *